United States Patent
Zyuban et al.

(10) Patent No.: US 10,908,663 B2
(45) Date of Patent: Feb. 2, 2021

(54) POWER SWITCH MULTIPLEXER WITH CONFIGURABLE OVERLAP

(71) Applicant: Apple Inc., Cupertino, CA (US)

(72) Inventors: Victor Zyuban, Sunnyvale, CA (US); Greg M. Hess, Mountain View, CA (US); Hemangi U. Gajjewar, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/433,801

(22) Filed: Jun. 6, 2019

(65) Prior Publication Data

US 2020/0387205 A1 Dec. 10, 2020

(51) Int. Cl.

| | |
|---|---|
| G06F 1/26 | (2006.01) |
| H02J 1/08 | (2006.01) |
| H03K 17/22 | (2006.01) |
| H03K 19/00 | (2006.01) |
| H03K 19/173 | (2006.01) |
| H03K 17/693 | (2006.01) |

(52) U.S. Cl.
CPC ............... G06F 1/263 (2013.01); H02J 1/08 (2013.01); H03K 17/223 (2013.01); H03K 17/693 (2013.01); H03K 19/0016 (2013.01); H03K 19/1733 (2013.01)

(58) Field of Classification Search
CPC .......... G06F 1/263; H02J 1/08; H03K 17/223; H03K 17/693; H03K 19/0016; H03K 19/1733
See application file for complete search history.

(56) References Cited

U.S. PATENT DOCUMENTS

| | | | |
|---|---|---|---|
| 8,105,885 B1* | 1/2012 | Lee | H01L 27/0207 257/E21.67 |
| 9,084,326 B2* | 7/2015 | Guan | H05B 45/14 |
| 9,654,101 B2 | 5/2017 | Cao et al. | |
| 9,852,859 B2 | 12/2017 | Cao et al. | |
| 2010/0295599 A1* | 11/2010 | Uehara | H04B 1/0071 327/355 |
| 2013/0169059 A1* | 7/2013 | Sun | H04B 5/0037 307/104 |
| 2017/0033796 A1* | 2/2017 | Cao | H03K 19/0016 |
| 2017/0186576 A1* | 6/2017 | Cao | H01H 47/00 |
| 2018/0004276 A1* | 1/2018 | Wong | G06F 1/3234 |

(Continued)

*Primary Examiner* — Adolf D Berhane
*Assistant Examiner* — Kevin H Sprenger
(74) *Attorney, Agent, or Firm* — Kowert, Hood, Munyon, Rankin & Goetzel, P.C.; Erik A. Heter (57) ABSTRACT

A power switch multiplexer with configurable overlap is disclosed. An integrated circuit (IC) includes a first functional circuit block coupled to receive a supply voltage from a first supply voltage node. The IC further includes an input circuit and an output circuit. Responsive to receiving an input signal, the input circuit asserts an activation signal to cause one of a second supply voltage node and a third supply voltage node to be electrically coupled to the first supply voltage node. Subsequently the input circuit asserts a deactivation signal to cause the other one of the second and third supply voltage nodes to be electrically decoupled from the first supply voltage node. The output circuit is coupled to receive the activation signal and the deactivation signal, and configured to assert a first output signal subsequent to receiving the activation signal.

20 Claims, 10 Drawing Sheets

(56) References Cited

U.S. PATENT DOCUMENTS

| | | | | |
|---|---|---|---|---|
| 2018/0152945 A1* | 5/2018 | Balteanu | ............... | H04L 5/1469 |
| 2018/0205386 A1* | 7/2018 | Kim | ..................... | H03K 21/026 |
| 2018/0284859 A1* | 10/2018 | Pant | ........................ | G06F 1/263 |
| 2019/0138079 A1* | 5/2019 | Arimilli | ................ | G06F 1/3206 |
| 2019/0391608 A1* | 12/2019 | Cao | ........................... | G05F 1/59 |

* cited by examiner

POWER SWITCH MULTIPLEXER WITH CONFIGURABLE OVERLAP

BACKGROUND

Technical Field

This disclosure is directed to electronic circuits, and more particularly, to circuits used for power distribution.

Description of the Related Art

Power switch multiplexers are used inside various types of integrated circuits to couple an internal power node to one of a number of different power supply nodes. For example, a given circuit may be coupled to receive power from an internal power node which, in turn, is coupled to receive power from one of two different external power nodes which carry different supply voltages with respect to one another.

A power switch multiplexer may select one of the different external power nodes to be electrically coupled to the internal power node. Power switches may be coupled between the internal power supply node and each of the external power supply nodes. A power switch may be activated to couple a selected one of the external power supply nodes to the internal power node. Meanwhile, a power switch may be deactivated to decouple the other external power supply node from the internal power supply node.

SUMMARY

A power switch multiplexer with configurable overlap is disclosed. In one embodiment, an integrated circuit (IC) includes a first functional circuit block coupled to receive a supply voltage from a first supply voltage node. The IC further includes an input circuit and an output circuit. Responsive to receiving an input signal, the input circuit asserts an activation signal to cause one of a second supply voltage node and a third supply voltage node to be electrically coupled to the first supply voltage node. Subsequently the input circuit asserts a deactivation signal to cause the other one of the second and third supply voltage nodes to be electrically decoupled from the first supply voltage node. The output circuit is coupled to receive the activation signal and the deactivation signal, and configured to assert a first output signal subsequent to receiving the activation signal.

In various embodiments of an IC, two or more instances of the power switch multiplexer may be coupled in a daisy chain configuration, with an output of one instance coupled to an input of another. These instances of a power switch multiplexer may operate in various modes. In a first mode, the output circuit of a first instance of a power switch multiplexer may assert an output signal upon completing the activation of a first set of power switches and before the deactivation of another set of power switches is complete. In this first mode, the next instance of a power switch multiplexer in the chain may begin activating power switches upon receiving the output signal from the first instance. In a second mode, a first power switch multiplexer may wait until both the first set of power switches is activated and the second set of power switches has been deactivated prior to asserting the output signal. The next instance, upon receiving the output signal, may begin activating a corresponding set of power switches. Individual instances of a power switch multiplexer may also operate in a bypass mode (in which input signal does not cause a change to the status of the power switches but does affect the output signal) and a sleep mode (in which all power switches are deactivated) are also contemplated.

BRIEF DESCRIPTION OF THE DRAWINGS

The following detailed description makes reference to the accompanying drawings, which are now briefly described.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

The present disclosure is directed to a circuit structure that implements a power switch multiplexer. In various embodiments, a first (internal) supply voltage node is coupled to provide a supply voltage to a functional circuit block of, e.g., an IC. The first, or internal supply voltage node may, in turn, receive power from one of two or more external (with respect to the functional circuit block) supply voltage nodes that may be coupled to the internal supply voltage node via corresponding power switches, when active. Each of the two or more external supply voltage nodes may carry different supply voltages with respect to one another. An input circuit, responsive to an input signal, may cause a change to which of the external supply voltage nodes is providing power to the internal supply voltage node.

In one embodiment, the input circuit may generate an activation signal to activate one or more power switches to couple a previously decoupled external supply voltage node to the internal supply voltage node. Thereafter, a deactivation signal generated by the input circuit causes deactivation of the supply voltage node that was coupled to the internal supply voltage node. An output circuit may assert an output signal subsequent to electrically coupling the previously decoupled external supply voltage node to the internal node. Depending on the mode of operation, this may occur either before or after completing the decoupling of the previously coupled external voltage node form the internal voltage node.

Each instance of a power switch multiplexer according to the disclosure may include an input circuit, and output circuit, and power switches coupled between each of the external supply voltage nodes and the internal supply voltage node. In one embodiment, the power switches may be implemented as transistors, with a number of power switches coupled between each external voltage node and the internal voltage node. Corresponding switches may be activated in a serial fashion responsive to assertion of the activation signal. Similarly, responsive to activation of the deactivation signal, the switches coupled to an external supply voltage node to be decoupled from the internal supply voltage node may be serially deactivated.

Multiple instances of the power switch multiplexer may be coupled in a daisy-chained fashion. This has implications with regard to the timing of assertion (or state change) of the output signal from output circuits in the daisy chain. In a first mode (which may be referred to as a full overlap mode), the output signal from a given output circuit is not asserted until both the electrically coupling of a previously decoupled supply voltage node, to internal supply voltage node, and electrically decoupling of a previously coupled external supply voltage node have been completed. As such, similar or same operation does not start in the next instance of the power switch multiplexer until the previously coupled external supply voltage node has been electrically decoupled from the internal supply voltage node. In a second mode (which may be referred to as the half overlap mode), the output circuit may assert the output signal upon completing the electrical coupling of a previously uncoupled supply voltage node to the internal supply voltage node, and before completing decoupling of the previously coupled supply voltage node from the internal supply voltage node. Accordingly, a next power switch multiplexer in the daisy chain may begin electrically coupling of its corresponding internal supply voltage node to a previously uncoupled supply voltage node, and thus prior to completion of the decoupling operation in the previous instance of the power switch multiplexer. A bypass mode may also be available to each instance of a power switch multiplexer, thereby allowing a signal to propagate from an input circuit to a corresponding output circuit without changing the status of which of the external supply voltage nodes is electrically coupled or decoupled with respect to the internal supply voltage node. Selection of the various modes of operation and control of each instance of a power switch multiplexer may be performed by a power management circuit. Various embodiments are now discussed below in reference to FIGS. 1-10.

Figure 1:
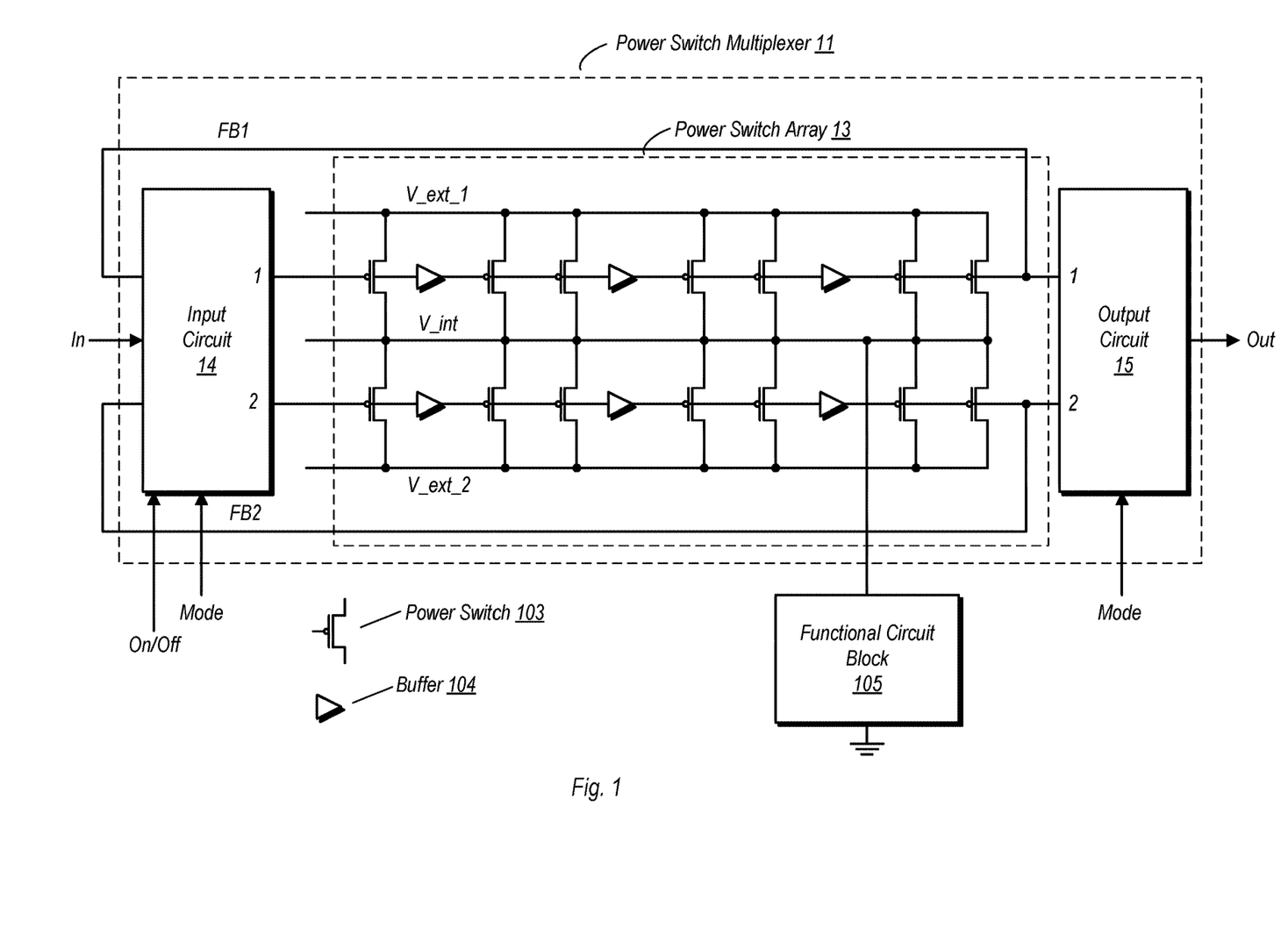
FIG. 1 is a schematic diagram of one embodiment of a power switch multiplexer.

FIG. 1 is a schematic diagram of one embodiment of a power switch multiplexer. In the embodiment shown, power switch multiplexer 11 includes an input circuit 14, an output circuit 15, and a power switch array 13 having a number of power switches 103 and buffers 104. The power switches 103 shown here are divided into two different groups. A first group of power switches 103 is coupled between external supply voltage node V_ext_1 and the internal supply voltage node, V_int. A second group of power switches 103 is coupled between external supply voltage node V_ext_2 and the internal supply voltage node. In this particular embodiment, the power switches 103 are PMOS transistors. Buffers coupled between respective gate terminals of at least some instances of power switches 103 in a particular group provide delay, and thus, the power switches 103 of that group are activated serially. This may reduce noise when switching from one supply voltage node to another, as well as reducing the amount of inrush current when activating a particular set of power switches 103.

As used herein, with respect to the voltage nodes, the term "external" indicates that the supply voltage carried on that particular node originates from a source external to the shown instance of power switch multiplexer 11. In contrast, the internal supply voltage node, V_int, is exclusive to that particular instance of power switch multiplexer 11. As shown in FIG. 1, the internal supply voltage node V_int is coupled to provide power to a functional circuit block 105, which may be virtually any type of digital, analog, or mixed signal circuitry (including memory circuits).

In the embodiment shown, input circuit 14 includes two outputs, labeled here as '1' and '2'. Similarly, the output circuit 15 includes corresponding inputs labeled '1' and '2'. Between these corresponding inputs and outputs, input circuit 14 may convey an activation signal (to activate power switches) and a deactivation signal (to deactivate power switches). The activation signal, as well as the deactivation signal, can originate from either of the outputs labeled '1' and '2'. During a switchover from one external voltage node to another (in terms of which is to be coupled to the internal voltage node), input circuit 14 generates an activation signal from one of its outputs, and generate the deactivation signal from the other one of its outputs. Since this particular embodiment utilizes PMOS transistors to implement power switches 103, the activation signal is an active low signal, while the deactivation signal is an active high signal. Accordingly, during a switchover input circuit 14 will output a logic low from one of its outputs and a logic high from the other one of its outputs.

Input circuit 14 in the embodiment shown is coupled to receive an input signal, labeled here as 'In'. Responsive to the input signal (or to a change of state thereof), input circuit 14 (in certain modes of operation) may perform the switchover operation described above. This is accomplished by initially outputting an active low activation signal from one of the outputs. The activation signal then propagates through the chain of power switches 103 and buffers 104 to activate the power switches and thus electrically couple the selected external voltage node to the internal voltage node. The activation signal is also received at the output circuit, and further, is fed back to the input circuit (via a corresponding one of feedback lines FB1 and FB2). Upon receiving (and responsive thereto), input circuit 14 outputs the active high deactivation signal from the other output relative to that from which the activation signal was conveyed. The deactivation signal propagates in a similar manner as the activation signal, serially deactivating corresponding power switches 103, until the previously coupled external supply voltage node is decoupled from the internal voltage node. The deactivation signal is then received by both the output circuit 15 as well as being fed back to the input circuit 14.

Output circuit 15 in the embodiment shown generates an output signal responsive to the other operations of power switch multiplexer 11. During a switchover operation, the generation of the output signal is dependent on a mode of operation, which is indicated by the mode signal input thereto (as received from a power management circuit to be discussed below). In a first mode, referred to herein as a full overlap mode, output circuit 15 asserts the output signal only after receiving both the activation and deactivation signals. In other words, the output signal is not asserted until both the previously decoupled external supply voltage node is fully coupled (all corresponding power switches active) to the internal supply voltage node, and the previously coupled external supply voltage node is fully decoupled (all corresponding power switches deactivated) from the internal supply voltage node. In a second mode of operation, referred to here as the half overlap mode, output circuit 15 asserts the output signal upon receiving the activation signal and prior to receiving the deactivation signal. In other words, the output signal is asserted by output circuit 15 upon completing the coupling of the previously decoupled external supply voltage node to the internal supply voltage node, but prior to completing the decoupling of the other external supply voltage node from the internal supply voltage node.

Although not shown here (but shown in FIG. 8), power switch multiplexer 11 may also include a bypass line coupled directly between input circuit 14 and output circuit 15. As such, power switch multiplexer 11 may also operate in a bypass mode. When in the bypass mode, input circuit 14 may, responsive to the input signal, pass a bypass signal directly to the output circuit 15, without changing the status of the power switches 103 in power switch array 13. This mode may be selected in accordance with mode select signals ('Mode') provided to both input circuit 14 and output circuit 15. It is noted that the mode select signal, while shown here as a single signal line, may be a multi-bit signal. The mode select signals may be provided from a power management circuit. In addition to selecting the various modes discussed above, the power management circuit may also cause power switch multiplexer 11 to operate in sleep mode, using the On/Off signal provided to input circuit 14. When in the sleep mode in which all power switches 13 are inactive (and thus, no external supply voltage is coupled to the internal supply voltage node). Accordingly, when the On/Off signal is received in the Off state, all power switches in that instance of power switch multiplexer 11 are turned off. When the On/Off signal is received in the On state, one set of power switches is activated, in accordance with the mode select signal. It is further noted that power switch multiplexer 11 may operate in the bypass mode concurrent with operation in the sleep mode.

It is noted that input circuit 14 and output circuit 15 may be implemented using any suitable type of logic circuitry, including hardwired logic, programmable logic, or any other type of circuitry that can carry out the functions described herein. Various ways of implementing these circuits will be apparent to those skilled in the art.

It is further noted that while the various examples discussed herein are based on a configuration in which one of two external supply voltage nodes may be coupled to an internal supply voltage node, the disclosure is not intended to be limited in this manner. Instead, any suitable number of external supply voltage nodes (e.g., three or more) may be used in an implementation of a power switch multiplexer in accordance with this disclosure.

Figure 2:
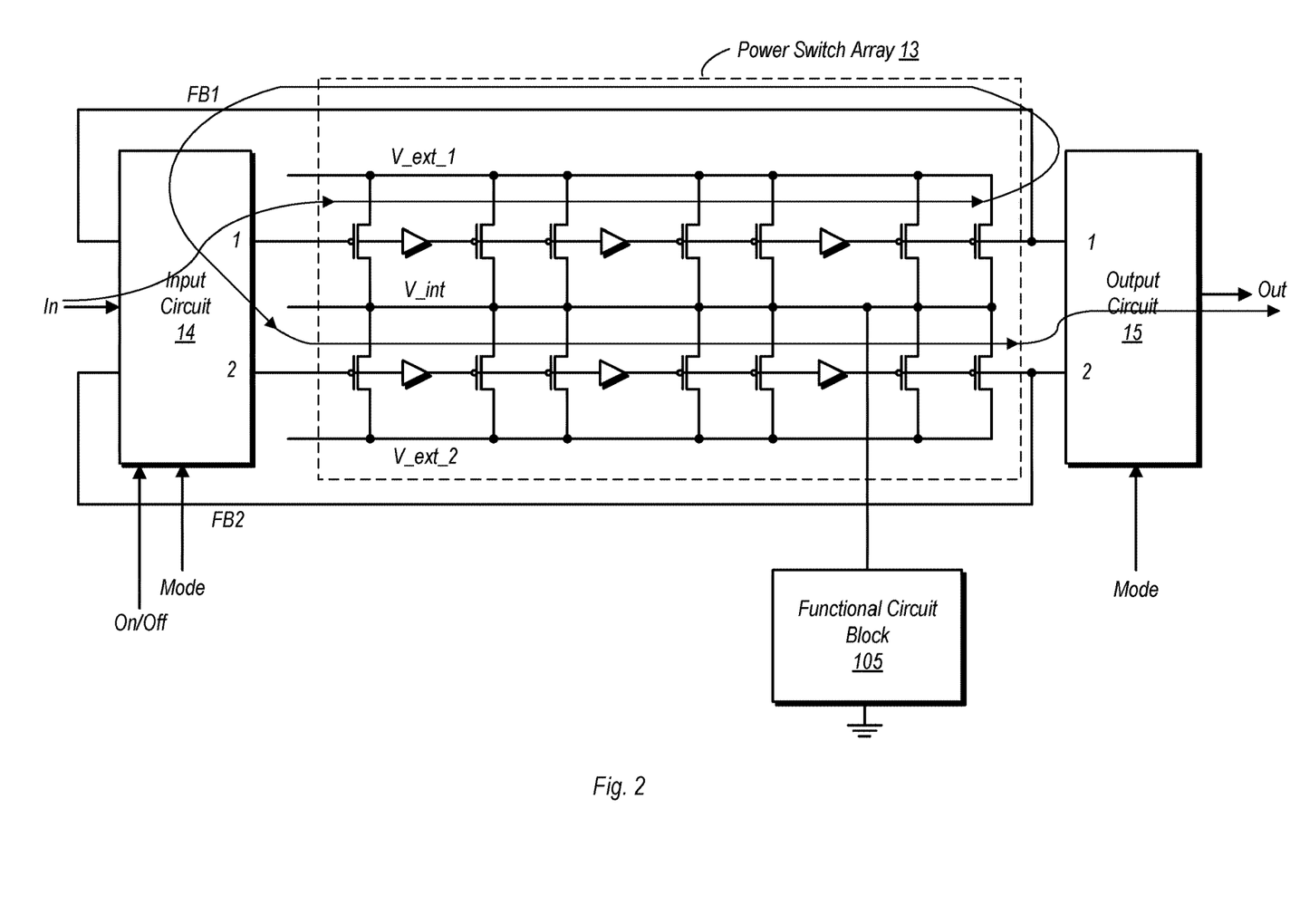
FIG. 2 is a schematic diagram illustrating operation of one embodiment of a power switch multiplexer in a first mode.

FIG. 2 is a schematic diagram illustrating operation of one embodiment of a power switch multiplexer in a first mode. As noted above, the first mode is referred to herein as the full overlap mode.

In this particular example, the initial conditions are that external supply voltage node V_ext_2 is electrically coupled to the internal supply voltage node V_int, while V_ext_1 is electrically decoupled from V_int. The operation illustrated here switches the voltage source for V_int from V_ext_2 to V_ext_1.

Responsive to the receiving the input signal, input circuit 14 asserts an active low activation signal on output 1. This signal propagates through the illustrated signal path between V_ext_1 and V_int, serially activating the PMOS power switches in the signal path. Upon reaching the end of the signal path through the power switches, the activation signal is received at input 1 of output circuit 15, and is also fed back to input circuit 14 through the FB1 feedback path. Upon receiving the activation signal via feedback path FB1, input circuit 14 asserts an active high deactivation signal. This signal is provided from output 2 into the correspondingly coupled signal path. As the activation signal propagates, the power switches coupled between V_ext_2 and V_int are deactivated. Upon reaching the end of this signal path, the activation signal is received at input 2 of output circuit 15, which then asserts the output signal on 'Out'. At this point of operation, V_ext_1 is now electrically coupled to V_int, while V_ext_2 is electrically decoupled from the same. Should it be desired to reverse this arrangement later, input circuit 14 can, responsive to an input signal, assert the active low activation signal on output 2, and subsequently assert the deactivation signal on output 1, in the manner described above.

The output signal asserted by output circuit 15 may be received as an input signal by a subsequently coupled instance of power switch multiplexer 11. The subsequent instance may respond to the input signal in the manner discussed above, if operating in the same mode, or in a different way if operating in a different mode. The other possible modes are discussed below.

Figure 3:
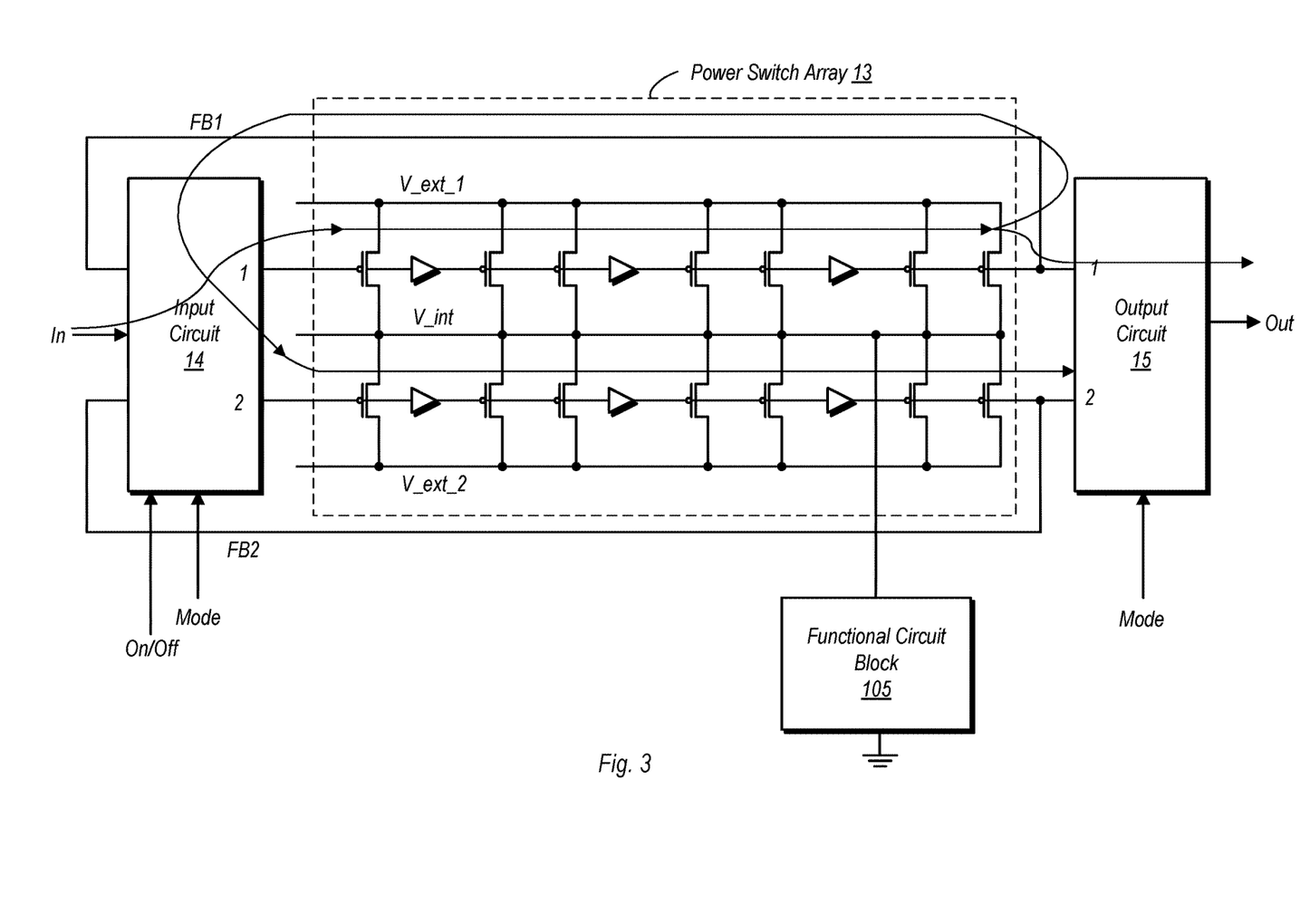
FIG. 3 is a schematic diagram illustrating operation of one embodiment of a power switch multiplexer in a second mode.

FIG. 3 is a schematic diagram illustrating operation of one embodiment of a power switch multiplexer in a second mode, referred to above as the half overlap mode. With respect to electrically coupling V_ext_1 to V_int and subsequently decoupling V_ext_2 from V_int, the operation is largely the same as that discussed above with reference to FIG. 2. However, when operating in the mode illustrated in FIG. 3, output circuit 15 asserts the output signal responsive to receiving the active low activation signal on input 1, rather than waiting to receive the deactivation signal on input 2. Accordingly, a subsequently coupled instance of power switch multiplexer 11 may begin its response to the asserted output signal before the deactivation phase of operation is complete.

Figure 4:
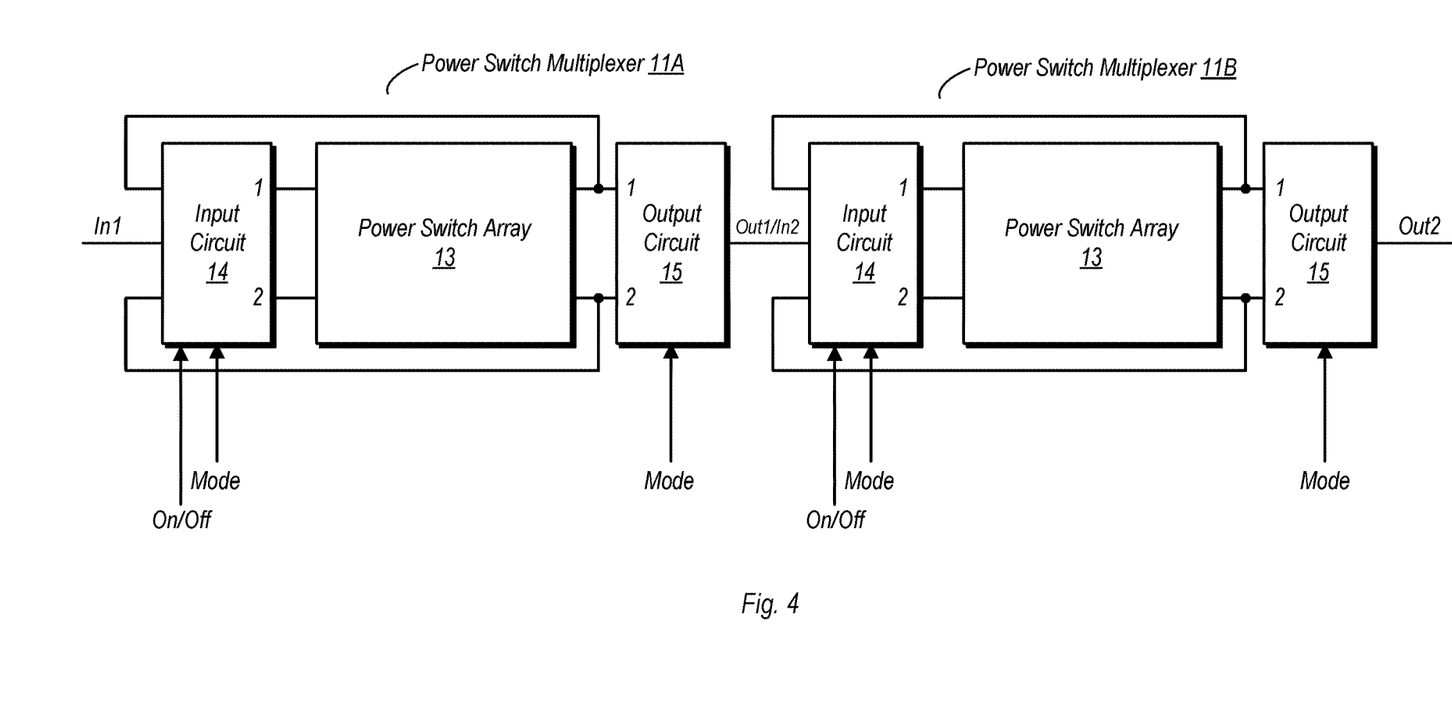
FIG. 4 is a block diagram illustrating a daisy-chained configuration of power switch multiplexers according to one embodiment.

FIG. 4 is a block diagram illustrating a daisy-chained configuration of power switch multiplexers according to one embodiment. As shown here, power switch multiplexer 11A is coupled in a daisy chain configuration with power switch multiplexer 11B. The output signal from the output circuit 15 of power switch multiplexer 11A, Out1, is equivalent to the input signal, In2, to input circuit 14 of power switch multiplexer 11B. The operation of these different power switch multiplexers at a given time is dependent on the mode select signals received by each. While both power switch multiplexers 11A and 11B may operate in the same mode at time, it is also possible that these different instances of a power switch multiplexer may operate in different modes with respect to one another.

Although the example shown includes two power switch multiplexers coupled in a daisy chain configuration, the number that may be so coupled is not limited by this drawing. On the contrary, the number of power switch multiplexers that can be coupled in a single daisy chain is limited only by practical considerations of the circuits/systems in which they are implemented.

Figure 5:
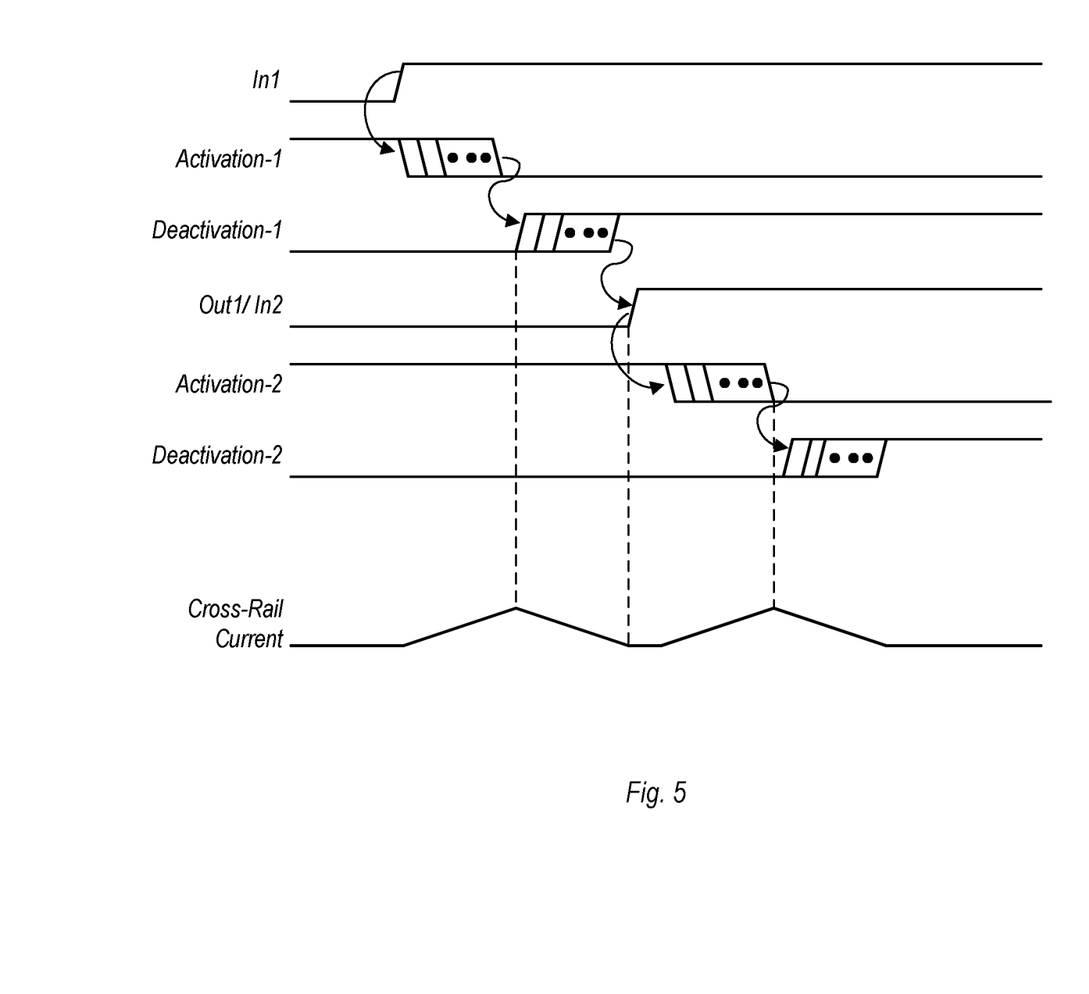
FIG. 5 is a timing diagram illustrating operation of a chain of power switch multiplexers in a first mode, according to one embodiment.

FIG. 5 is a timing diagram illustrating operation of a chain of power switch multiplexers in a first mode, according to one embodiment. More particularly, FIG. 5 illustrates one example of the timing for two power switch multiplexers coupled to one another when both are operating in the full overlap mode. Additionally, these diagrams (FIGS. 5 and 6) illustrate the changing current between power supply rails (nodes) during a portion when two different power supply nodes are both at least partially coupled to the internal power node.

In FIG. 5, when the input signal In1 to the first power switch multiplexer is asserted, a first activation signal, Activation-1 (active low in this example) is also asserted and begins propagating to sequentially activate correspondingly coupled power switches. At the same time the cross-rail current begins to rise, since more than one external voltage supply is electrically coupled to the internal voltage node. Upon completion of the activation of the power switches due to the propagation of the first activation signal, the cross-rail current reaches a peak and the active high first deactivation signal, Deactivation-1 is asserted.

The assertion and propagation of the first deactivation signal causes power switches in the corresponding signal path to be deactivated, while the cross-rail current begins to fall. Upon completing the deactivation of all power switches in the corresponding path, the cross-rail current falls to a minimum, while the first output signal, Out1 is activated. Since Out1 and In2 are effectively the same signal, the assertion of this signal begins another activation cycle in the next power switch multiplexer with the assertion of a second activation signal, Activation-2. As this second activation signal propagates through its corresponding signal path, the cross-rail currents rise again, peaking at the point when all of the switches in the corresponding signal path are active. Thereafter, the second deactivation signal, Deactivation-2, is asserted and propagates through its corresponding signal path to cause deactivation of previously active power switches. Concurrent with the deactivation of these power switches, the cross-rail current falls again, reaching its minimum (e.g., zero, or a negligible value due to some leakage) when the second deactivation signal has fully propagated to deactivate all power switches in its corresponding signal path.

Figure 6:
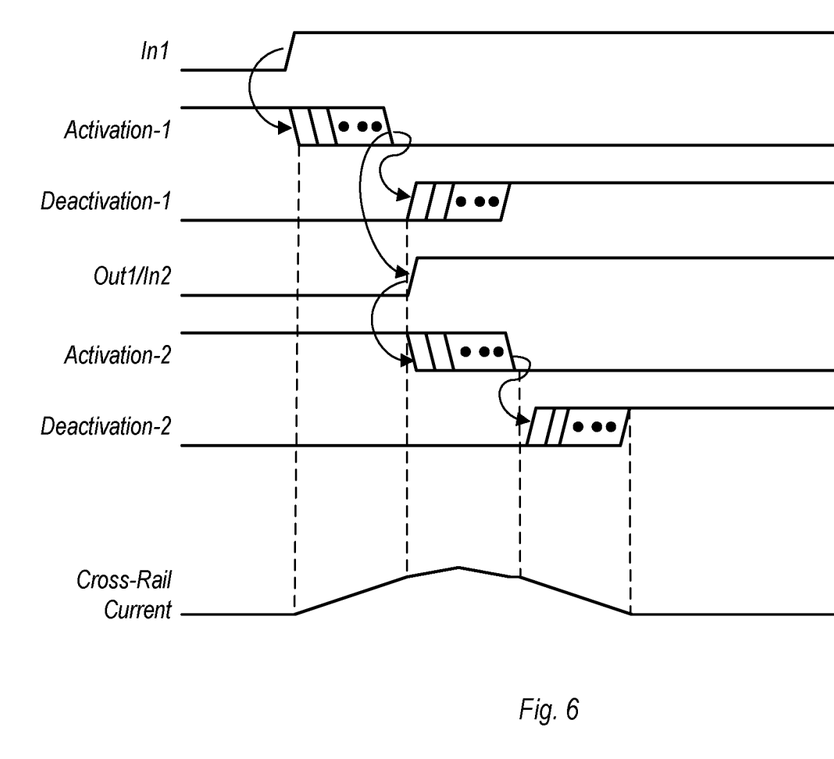
FIG. 6 is a timing diagram illustrating operation of a chain of power switch multiplexers in a second mode, according to one embodiment.

FIG. 6 is a timing diagram illustrating operation of a chain of power switch multiplexers in a second mode, according to one embodiment. The second mode, as referred to herein, is known as the half overlap mode. As with FIG. 5, the example timing diagram shown here is applicable to an embodiment of two power switch multiplexers coupled to one another in a daisy chain, with both operating in the same mode.

The operation depicted by FIG. 6 begins with the assertion of the first input signal, In1 to a first power switch multiplexer. Responsive to the assertion of the first input signal, a first activation signal, Activation-1, is asserted and begins propagation through a corresponding signal path. As the active low first activation signal reaches the gate of each PMOS power switch, that device is activated to electrically couple one of the external supply voltage nodes to the internal supply voltage node of the first power switch multiplexer. As the power switches are serially activated, the cross-rail current rises as shown.

Upon completing the activation phase in the first power switch multiplexer, the first (active high) deactivation signal, Deactivation-1, is asserted and begins propagating through a corresponding signal path to cause deactivation of power switches implemented therein. However, in contrast to operation in the full overlap mode described above with reference to FIG. 5, the first output/second input signal is asserted upon completing the first activation phase, rather than waiting until the first deactivation phase is completed. With the assertion of the second input signal, In2, a second (active low) activation signal, Activation-2, is asserted and begins propagating to activate power switches in a second power switch multiplexer. Concurrent with this operation is the deactivation of power switches due to the propagation of Deactivation-1 continues. During this phase of operation, the two external supply voltage nodes common to both power switch multiplexers are electrically coupled to one another via active power switches through their respective internal supply voltage nodes. It is during this phase that the cross-rail current reaches a peak for this particular example.

The end of the deactivation phase in the first power switch multiplexer and activation phase in the second power switch multiplexer may occur close to one another in time. Responsive to the latter, the second deactivation signal, Deactivation-2, is asserted in the second power switch multiplexer. During this time, the cross-rail current falls again, reaching its minimum as the second deactivation phase completes.

Figure 7:
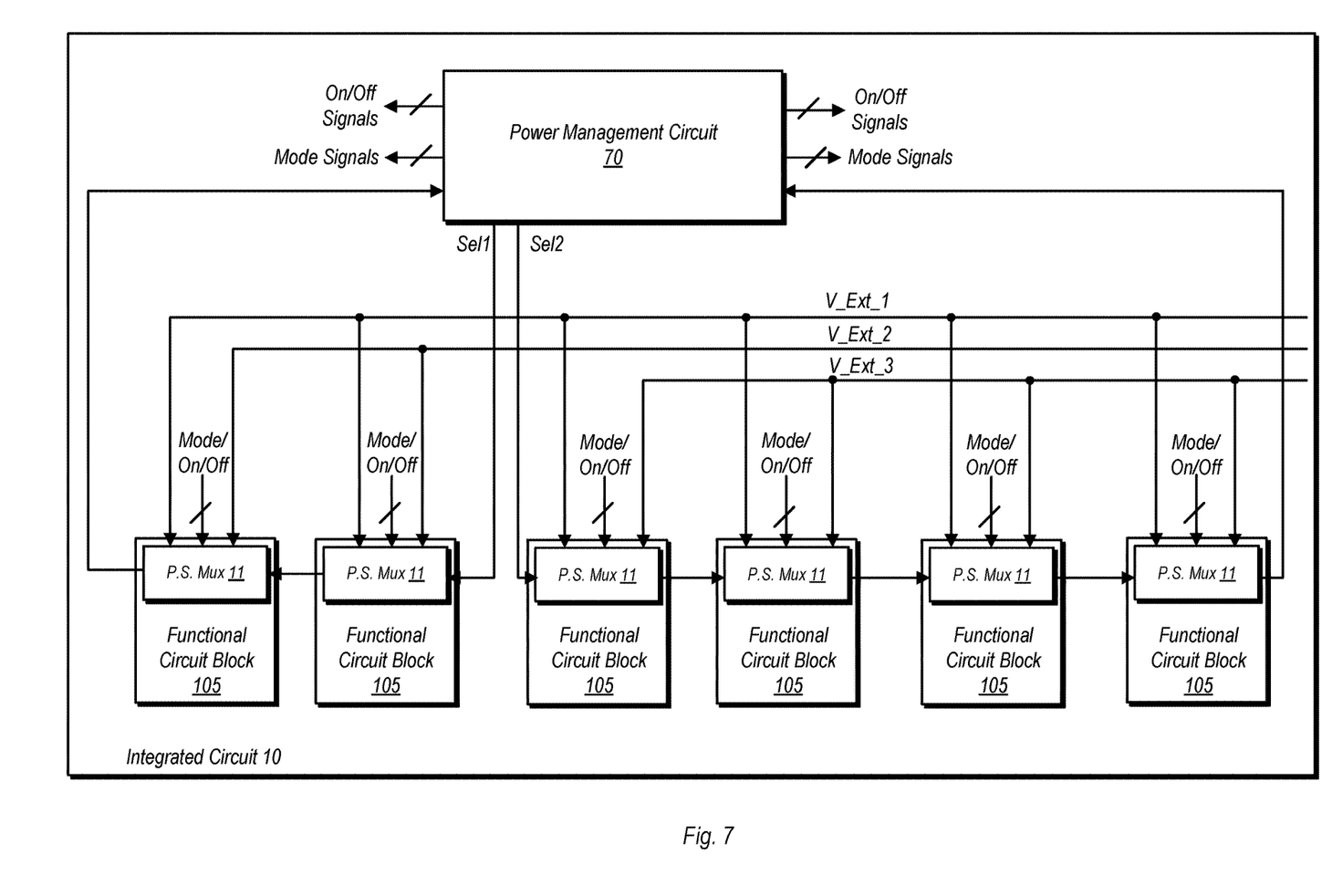
FIG. 7 is a block diagram of one embodiment of an integrated circuit.

FIG. 7 is a block diagram of one embodiment of an integrated circuit have a number of power switch multiplexers. In the embodiment shown, IC 10 includes a number of functional circuit blocks 105, each of which includes a corresponding instance of power switch multiplexer 11. IC 10 as shown here also includes three different external voltage nodes, V_Ext_1, V_Ext_2, and V_Ext_3. Any or all of these voltages may be received from a source external to IC 10, or, alternatively, may be generated on-chip through, e.g., corresponding voltage regulator circuits. Each of these voltages may be different from one another, and in some embodiments, may also be adjustable during operation of IC 10. A first two of the functional circuit blocks 105 (on the left hand side of the drawing) are coupled to receive supply voltages via V_Ext_1 and V_Ext_2. Each of the remaining functional circuit blocks 105 are coupled to receive supply voltages via V_Ext_1 and V_Ext_3. It is noted, however, that embodiments are possible and contemplated in which more than two supply voltage nodes are coupled to provide power to a given functional circuit block, and any power switch multiplexer 11 implemented therein may be arranged accordingly.

IC 10 in the embodiment shown include a power management circuit 70. Power management circuit 70 in the embodiment shown is configured to provide a respective On/Off signal to each of power switch multiplexers 11. When a given power switch multiplexer 11 receives this signal in the Off state, all power switches in that instance are turned off. When the On/Off signal is received in the On state by a given instance of power supply multiplexer 11, power switches may be activated to electrically couple an external supply voltage node to the internal supply voltage node. Power management circuit 70 also provides mode select signals to each of the power switch multiplexers 11, and also inputs a select signal (e.g., Sel1, Sel2) to a first one of each daisy chain of power switch multiplexers 11. Additionally a last power switch multiplexer 11 in each of the daisy chains is coupled to provide its output signal to power management circuit 70 as an indication that operations are complete. The various modes that a power switch multiplexer 11 may operate under control of power management circuit 70 include the full and half overlap modes discussed above, a bypass mode, as well as various permutations of a sleep mode which can include powering down a functional circuit block by deactivating all power switches in an associated instance of power switch multiplexer 11. Furthermore, the respective mode of each power switch multiplexer 11 may be set independently of the modes of other power switch multiplexers, including those in the same daisy chain.

Figure 8:
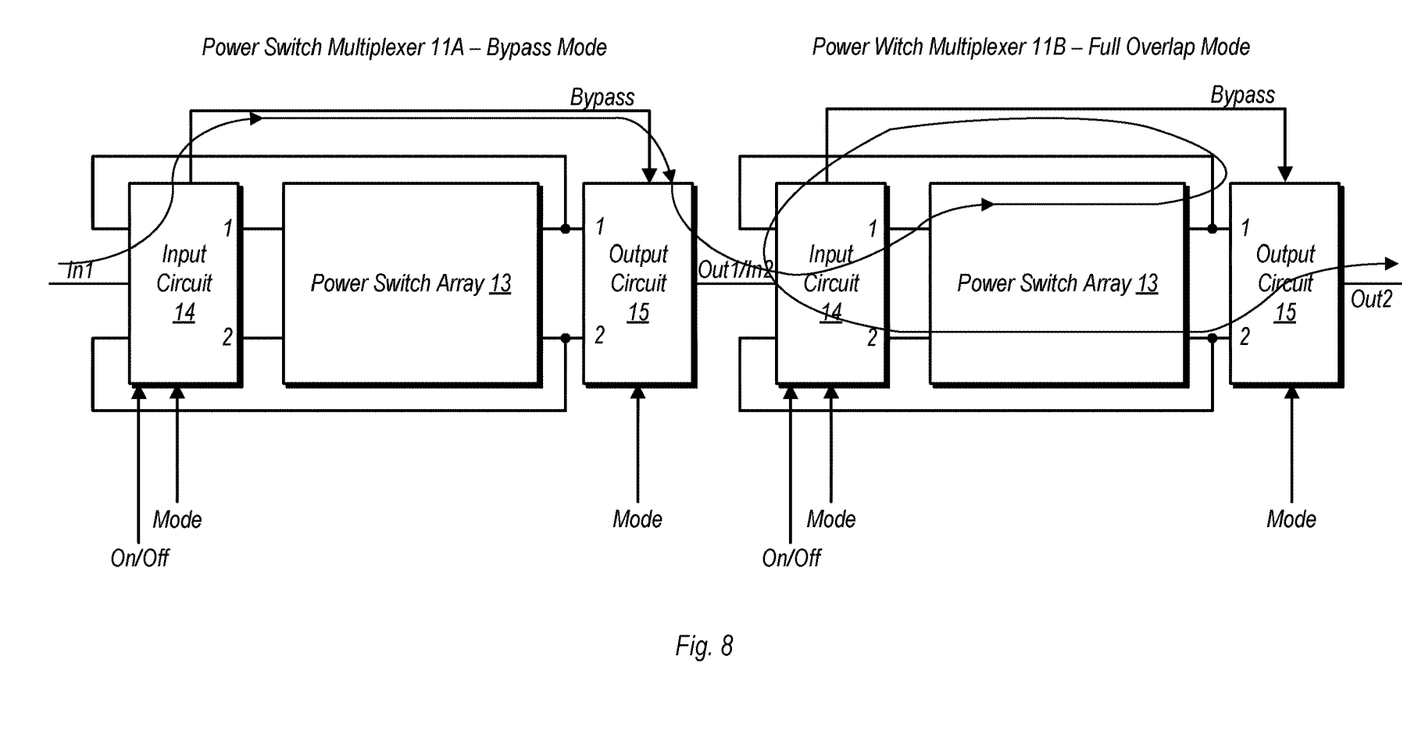
FIG. 8 is a block diagram of illustrating a daisy-chained configuration of power switch multiplexers according to one embodiment operating in a third mode.

FIG. 8 is a block diagram of illustrating a daisy-chained configuration of power switch multiplexers according to one embodiment operating in a third mode. In the embodiment shown, power switch multiplexer 11A is operating in the bypass mode, while power switch multiplexer 11B is operating in the full overlap mode discussed above. As shown, both of the power switch multiplexers include a bypass path (labeled 'Bypass') coupled directly between their respective input and output circuits. When operating in the bypass mode, the input circuit 14 of the power switch multiplexer asserts the bypass signal, which is provided via the bypass path directly to the output circuit 15. The output circuit then asserts its output signal (which is conveyed to the next instance of a power switch multiplexer in this example). The power switch multiplexer that is operating in the bypass mode otherwise maintains its current state, meaning no changes to the status of any of the power switches within is power switch network 13 occur.

Operation in the bypass mode may be useful in instances when it is desirable to change the status of one or more power switch multiplexers 11 in a daisy chain while leaving the status of others unchanged. For example, if it is desirable to change which of the external supply voltage nodes from which power is provided to the internal supply voltage node of a given power switch multiplexer 11 while leaving another unchanged, the latter may be operated in the bypass mode. A correspondingly coupled power management circuit may set the power switch multiplexer 11 that is to remain unchanged in the bypass mode, and then may provide the selection signal to the daisy chain of power switch multiplexers. When the input signal is received by the power switch multiplexer 11 operating in the bypass mode, it may simply pass the bypass signal to the output circuit while no power switches internal thereto are activated or deactivated. When the other instances of a power switch multiplexer 11 receive the appropriate signal on their respective inputs, they may operate in accordance with their current mode of operation (such as the full overlap mode shown in the example of FIG. 8).

Figure 9:
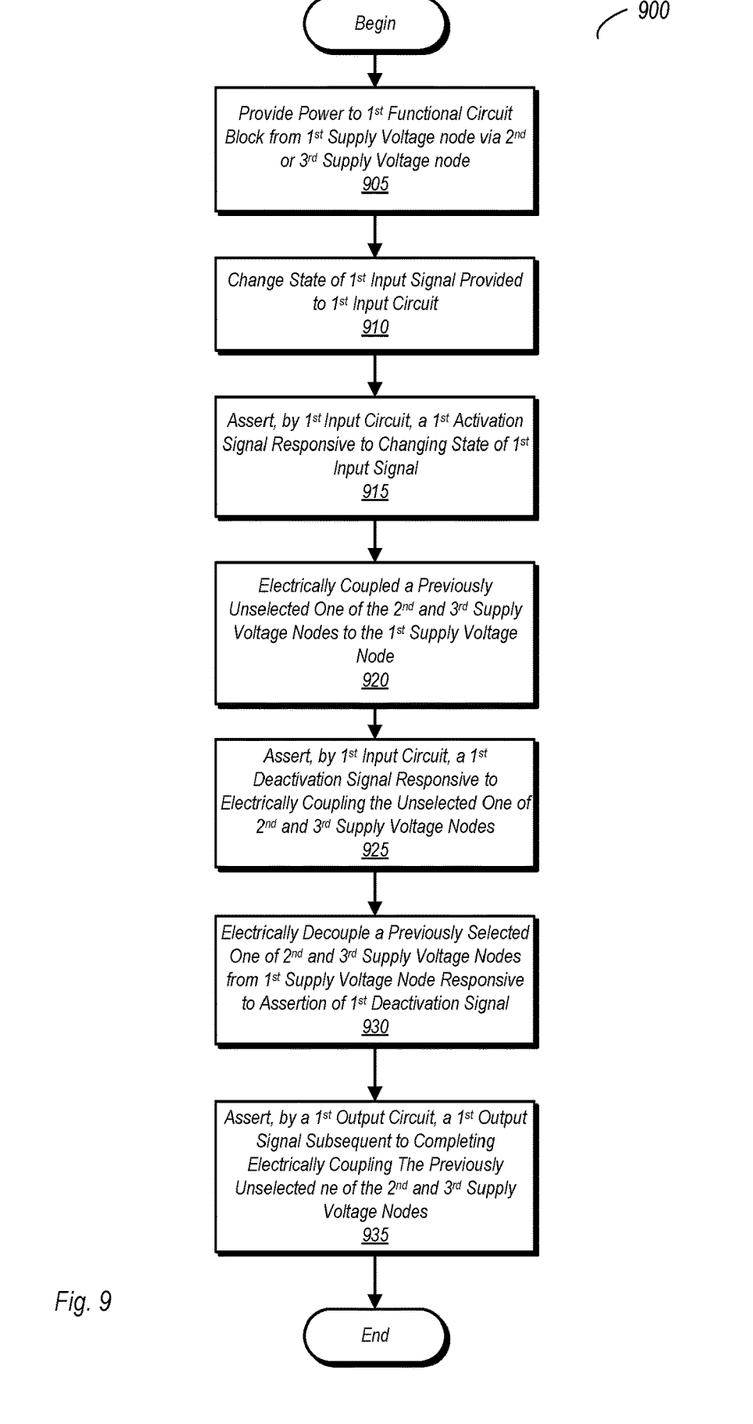
FIG. 9 is a flow diagram illustrating operation of one embodiment of a power switch multiplexer.

FIG. 9 is a flow diagram illustrating operation of one embodiment of a power switch multiplexer. Method 900 may be performed with any embodiment of a power switch multiplexer 11 as discussed above with reference to FIGS. 1-8. In addition, embodiments of a power switch multiplexer capable of carrying out method 900 not explicitly discussed herein may also fall within the scope of this disclosure.

Method 900 begins with providing power to a first functional circuit block from a first supply voltage node via one of a second supply voltage node and a third supply voltage node (block 905). The method further includes changing a state of a first input signal provided to a first input circuit (block 910) and asserting, by the first input circuit, a first activation signal responsive to the changing of the state of the first input signal (block 915). The method then includes electrically coupling a previously unselected one of the second and third supply voltage nodes to the first supply voltage node responsive to asserting the first activation signal (block 920).

After completing the electrical coupling of the previously unselected voltage node to the first supply voltage node, the method continues with asserting, by the first input circuit, a first deactivation signal responsive to electrically coupling the previously unselected one of the second and third supply voltage nodes (block 925). The method then continues with electrically decoupling of a previously selected one of the second and third supply voltage nodes from the first supply voltage node responsive to asserting the first deactivation signal (block 930). The method concludes with the assertion, by a first output circuit, a first output signal subsequent to completing electrically coupling the previously unselected one of the second and third supply voltage nodes (block 935).

In various embodiments, the method includes the first output circuit asserting the first output signal responsive to completing both electrically coupling the previously unselected one of the second and third supply voltage nodes to the first supply voltage node and decoupling the previously selected one of the second and third supply voltage nodes from the first supply voltage node (e.g., when operating in a first mode). In other embodiments, the method includes the first output circuit asserting the first output signal responsive to completing electrically coupling the previously unselected one of the second and third supply voltage nodes and prior to completing decoupling the previously selected one of the second and third supply voltage nodes from the first supply voltage node.

In various embodiments, electrically coupling the previously unselected one of the second and third supply voltage nodes to the first supply voltage node comprises serially activating a plurality of power switches coupled between the previously unselected one of the second and third supply voltage nodes and the first supply voltage node. The method may also include electrically decoupling the previously selected one of the second and third supply voltage nodes from the first supply voltage node by serially deactivating a plurality of power switches coupled between the previously selected one of the second and third supply voltage nodes and the first supply voltage node.

In various embodiments, two or more instances of a power switch multiplexer are coupled together serially, in a daisy-chain configuration. Embodiments of the method carried out by such a configuration include, in a second instance of the power switch multiplexer, providing power to a second functional circuit block from a fourth supply voltage node, receiving, at a second input circuit, the first output signal from the first output circuit, and asserting a second activation signal to cause electrical coupling of the unselected one of the second and third voltage nodes to a fourth voltage node. Subsequent to coupling the unselected one of the second and third voltage nodes to a fourth voltage node, the method includes asserting a second deactivation signal to cause electrical decoupling of the selected one of the second and third voltage nodes from the fourth voltage node.

Subsequent to coupling the unselected one of the second and third voltage nodes to a fourth voltage node, the method includes asserting, by a second output circuit, a second output signal.

Figure 10:
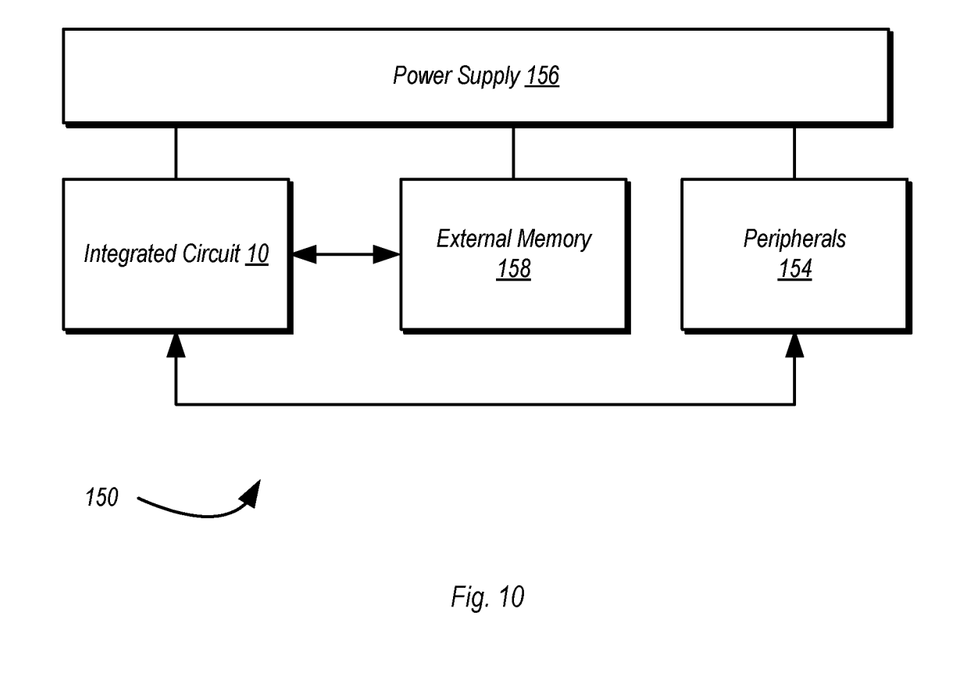
FIG. 10 is a block diagram of one embodiment of an example system.

FIG. 10 is a block diagram of one embodiment of an example system. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

System 150 in the embodiment shown may include one or more instances of a power switch multiplexer 11 as discussed above in reference to FIGS. 1-9. Various embodiments of a power switch multiplexer 11 as discussed herein may be implemented in IC 10, in various ones of peripherals 154, and in memory 158.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
   a first functional circuit block coupled to receive a supply voltage from a first supply voltage node; and
   a first power switch network comprising:
      a first input circuit configured to, responsive to receiving a first input signal, assert a first activation signal to cause one of a second supply voltage node and a third supply voltage node to be electrically coupled to the first supply voltage node and subsequently assert a first deactivation signal to cause the other one of the second and third supply voltage nodes to be electrically decoupled from the first supply voltage node; and a first output circuit coupled to receive the first activation signal and the first deactivation signal, and configured to:
during operation in a first mode, assert a first output signal to a first logic level from a second, different logic level, responsive to receiving the first activation signal and prior to receiving the first deactivation signal at a logic level equivalent to that of the first activation signal; and
during operation in a second mode, assert the first output signal from the first logic level to the second logic level responsive to receiving both the first activation signal and the first deactivation signal at equivalent logic levels; and
a second power switch network having a second input circuit, wherein the second input circuit is configured to assert a second activation signal responsive to the first output circuit asserting the first output signal to the first logic level.

2. The integrated circuit as recited in claim 1, further comprising a first plurality of power switches coupled between the second supply voltage node and the first supply voltage node and a second plurality of power switches coupled between the third supply voltage node and the first supply voltage node.

3. The integrated circuit as recited in claim 2, wherein power switches of ones the first and second plurality of power switches are arranged to be sequentially activated responsive to receiving the activation signal and to be sequentially deactivated responsive to receiving the deactivation signal.

4. The integrated circuit as recited in claim 1, wherein the first input circuit is configured to assert the deactivation signal responsive to completion of coupling of the one of the second and third supply voltage nodes to the first supply voltage node.

5. The integrated circuit as recited in claim 1, wherein the first output circuit is configured to assert the first output signal responsive to receiving the activation signal and prior to receiving the deactivation signal.

6. The integrated circuit as recited in claim 1, wherein the first output circuit is configured to assert the first output signal responsive to receiving the deactivation signal, wherein the deactivation signal is received subsequent to receiving the activation signal.

7. The integrated circuit as recited in claim 1, wherein the first output circuit is coupled to receive the activation signal responsive to completing of electrically coupling of one of the second and third supply voltage nodes to the first supply voltage node, and further coupled to receive the deactivation signal responsive to decoupling of the other one of the second and third supply voltage nodes from the first supply voltage node.

8. The integrated circuit as recited in claim 1, wherein the output circuit is configured to operate in a third mode responsive to receiving a bypass signal from the input circuit, and wherein, when operating in the third mode:
the first input circuit is configured to assert the bypass signal responsive to receiving the input signal; and
the first output circuit is configured to assert the output signal responsive to receiving the bypass signal from the input circuit.

9. The integrated circuit as recited in claim 1, wherein the input circuit is further configured to cause the functional circuit block to operate in a fourth mode, wherein, during operation in the fourth mode, the input circuit is configured to cause the second and third supply voltage nodes to be electrically decoupled form the first supply voltage node.

10. The integrated circuit as recited in claim 1, further comprising:
a second functional circuit block coupled to receive a supply voltage from a fourth supply voltage node, wherein the second input circuit of the second power switch includes:
an input coupled to receive, as a second input signal, the first output signal from the first output circuit, wherein the second input circuit is configured to assert the second activation signal to couple one of the second and third supply voltage nodes to the fourth supply voltage node, and further configured to assert a second deactivation signal to decouple the other one of the second and third supply voltage nodes from the fourth supply voltage node; and
a second output circuit coupled to receive the second activation signal and the second deactivation signal, and configured to assert a second output signal subsequent to receiving the second activation signal; and
a power management circuit coupled to provide mode control signals to ones of the first and second power switch networks, wherein the ones of the first and second power switch networks are configured to operate in one of a plurality of operational modes based on respectively received mode control signals.

11. A method comprising:
providing power to a first functional circuit block from a first supply voltage node via one of a second supply voltage node and a third supply voltage node;
changing a state of a first input signal provided to a first input circuit to a second logic level from a first logic level;
asserting by the first input circuit, a first activation signal responsive to the changing of the state of the first input signal;
electrically coupling a previously unselected one of the second and third supply voltage nodes to the first supply voltage node responsive to asserting the first activation signal;
asserting by the first input circuit, a first deactivation signal responsive to electrically coupling the previously unselected one of the second and third supply voltage nodes;
electrically decoupling a previously selected one of the second and third supply voltage nodes from the first supply voltage node responsive to asserting the first deactivation signal;
asserting, to the first logic level by a first output circuit, a first output signal subsequent to completing electrically coupling the previously unselected one of the second and third supply voltage nodes, wherein during operation in a first mode, the first output signal is asserted responsive to receiving the first activation signal and prior to receiving the first deactivation signal at a logic level equivalent to that of the first activation signal, and during operation in a second mode, the output signal is asserted responsive to receiving both the first activation signal and the first deactivation signal at equivalent logic levels; and
asserting, by a second input circuit, a second activation signal to the first logic level responsive to the first output circuit asserting the first output signal to the first logic level.

12. The method as recited in claim 11, further comprising the first output circuit asserting the first output signal responsive to completing both electrically coupling the previously unselected one of the second and third supply voltage nodes to the first supply voltage node and decoupling the previously selected one of the second and third supply voltage nodes from the first supply voltage node.

13. The method as recited in claim 11, further comprising the first output circuit asserting the first output signal responsive to completing electrically coupling the previously unselected one of the second and third supply voltage nodes and prior to completing decoupling the previously selected one of the second and third supply voltage nodes from the first supply voltage node.

14. The method as recited in claim 11, wherein electrically coupling the previously unselected one of the second and third supply voltage nodes to the first supply voltage node comprises serially activating a plurality of power switches coupled between the previously unselected one of the second and third supply voltage nodes and the first supply voltage node.

15. The method as recited in claim 11, wherein electrically decoupling the previously selected one of the second and third supply voltage nodes from the first supply voltage node comprises serially deactivating a plurality of power switches coupled between the previously selected one of the second and third supply voltage nodes and the first supply voltage node.

16. The method as recited in claim 11, further comprising:
providing power to a second functional circuit block from a fourth supply voltage node;
receiving, at the second input circuit, the first output signal at the first logic level from the first output circuit;
asserting, to the first logic level, the second activation signal to the first logic level to cause electrical coupling of the unselected one of the second and third voltage nodes to a fourth voltage node;
subsequent to coupling the unselected one of the second and third voltage nodes to the fourth supply voltage node, asserting, to the first logic level, a second deactivation signal to cause electrical decoupling of the selected one of the second and third voltage nodes from the fourth voltage node; and
subsequent to coupling the unselected one of the second and third voltage nodes to the fourth supply voltage node, asserting, by a second output circuit, a second output signal to the first logic level.

17. A system comprising:
a first functional circuit block coupled to receive a supply voltage from a first supply voltage node;
a first power switching circuit comprising:
a first plurality of power switches coupled between a second supply voltage node and the first supply voltage node, wherein the first plurality of power switches is configured to, when active, electrically couple the first supply voltage node to the second supply voltage node;
a second plurality of power switches coupled between a third supply voltage node and the first supply voltage node, wherein the second plurality of power switches is configured to, when active, electrically couple the third supply voltage node to the first supply voltage node;
an input circuit coupled to receive an input signal asserted at a first logic level different from a second logic level, and configured to propagate a first control signal to sequentially activate a previously inactive one of the first and second plurality of power switches, and subsequently propagate a second control signal to sequentially deactivate a previously active one of the first and second plurality of power switches; and
an output circuit coupled to receive the first and second control signals and configured to output, at the first logic level, a third control signal subsequent to the first control signal causing the first one of the first and second plurality of power switches to be activated;
wherein, during operation in a first mode, the output circuit is configured to output the third control signal at the first logic level responsive to receiving the first control signal and prior to receiving the second control signal at a logic level equivalent to that of the first control signal, and wherein during operation in a second mode, the output circuit is configured to output the third control signal at the first logic level responsive to receiving both the first control signal and the second control signal at equivalent logic levels.

18. The system as recited in claim 17, wherein the input circuit is configured to assert the second control signal responsive to completing activation of the previously active one of the first one of the first and second plurality of power switches.

19. The system as recited in claim 17, further comprising a second functional circuit block, wherein the output circuit is coupled to an input circuit in the second functional circuit block.

20. The system as recited in claim 19, wherein the input circuit in the second functional circuit block is configured to assert a fourth control signal responsive to receiving the third control signal asserted at the first logic level.

* * * * *